United States Patent
Ozalevli et al.

(10) Patent No.: US 10,469,073 B1
(45) Date of Patent: Nov. 5, 2019

(54) SIGNAL RECONSTRUCTION CIRCUIT

(71) Applicant: TEXAS INSTRUMENTS INCORPORATED, Dallas, TX (US)

(72) Inventors: Erhan Ozalevli, Santa Clara, CA (US); Mustapha El Markhi, Richardson, TX (US); Rohit Bhan, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/047,589

(22) Filed: Jul. 27, 2018

(51) Int. Cl.
*H03K 17/16* (2006.01)
*H03K 17/082* (2006.01)
*H02M 3/335* (2006.01)

(52) U.S. Cl.
CPC ....... *H03K 17/161* (2013.01); *H03K 17/0822* (2013.01); *H02M 3/33507* (2013.01)

(58) Field of Classification Search
CPC ............ H03K 17/161; H03K 17/0822; H02M 3/33507
USPC .......................................................... 327/109
See application file for complete search history.

(56) References Cited

U.S. PATENT DOCUMENTS

| | | | | |
|---|---|---|---|---|
| 5,418,410 A * | 5/1995 | Tisinger | ............... | H03K 17/161 327/387 |
| 6,144,245 A * | 11/2000 | Balogh | ............... | H03K 17/0822 323/282 |
| 6,219,262 B1 * | 4/2001 | Burgyan | ........... | H02M 3/33507 363/21.04 |
| 2008/0211471 A1 * | 9/2008 | Liao | ....................... | H02M 3/156 323/282 |
| 2010/0164570 A1 * | 7/2010 | Priego | ..................... | H02M 1/44 327/157 |
| 2012/0205978 A1 * | 8/2012 | Wong | ........................ | G05F 1/56 307/31 |
| 2018/0248466 A1 * | 8/2018 | Pham | ...................... | H02M 1/08 |

* cited by examiner

*Primary Examiner* — Ryan Jager
(74) *Attorney, Agent, or Firm* — Tuenlap Chan; Charles A. Brill; Frank D. Cimino (57) ABSTRACT

Aspects of the present disclosure provide for a circuit, comprising a first node configured to couple to a first current source and a second current source. The circuit also comprises a first filter configured to couple between a voltage supply and the first node, the first filter being a first dynamically controllable current filter. The circuit further comprises a current mirror coupled between the first node and a second node configured to couple to a third current source and a fourth current source. The circuit additionally comprises a second filter configured to couple between the second node and a ground node, the second filter being a second dynamically controllable current filter.

20 Claims, 7 Drawing Sheets

SIGNAL RECONSTRUCTION CIRCUIT

BACKGROUND

A switch mode power supply (SMPS) transfers power from an input power source or supply to a load by switching one or more power transistors coupled through a switch node/terminal to an energy storage element (such as an inductor/transformer and/or capacitor), which is capable of coupling to the load. The power transistors can be included in a power converter that includes, or is capable of coupling to, the energy storage element. A SMPS can include a controller to provide one or more gate drive signals to the power transistor(s).

SUMMARY

Aspects of the present disclosure provide for a circuit comprising a first node configured to couple to a first current source and a second current source. The circuit also comprises a first filter configured to couple between a voltage supply and the first node, the first filter being a first dynamically controllable current filter. The circuit further comprises a current mirror coupled between the first node and a second node configured to couple to a third current source and a fourth current source. The circuit additionally comprises a second filter configured to couple between the second node and a ground node, the second filter being a second dynamically controllable current filter.

Other aspects of the present disclosure provide for a system comprising a sense element configured to provide a sense signal, a signal reconstruction circuit configured to couple at a first node to the sense element, and a control circuit. In an example, the signal reconstruction circuit comprises a first filter configured to couple between the first node and a voltage supply and filter a current present at the first node the first filter being a first dynamically controllable current filter, a current mirror coupled between the first node and a second node and configured to approximately mirror a current present at the first node to the second node, and a second filter configured to couple between the second node and a ground node and filter a current present at the second node, the second filter being a second dynamically controllable current filter. In an example, the control circuit is coupled to the first node and the second node and is configured to generate and provide a first signal to the first node, the first signal having a first current subtracted from the first node, generate and provide a second signal to the second node, the second signal having a second current added to the second node, and generate and provide a third signal to the second node, the third signal having a third current added to the second node.

Other aspects of the present disclosure provide for a method. In an example, the method includes receiving, by a circuit, a sense signal representative of an inductor current of a power converter, subtracting, by the circuit, a first current from the sense signal, filtering, by the circuit, the sense signal, adding, by the circuit, a second current to the sense signal, adding, by the circuit, a third current to the sense signal to generate a reconstructed sense signal, and filtering, by the circuit, the reconstructed sense signal.

BRIEF DESCRIPTION OF THE DRAWINGS

For a detailed description of various examples, reference will now be made to the accompanying drawings in which.

DETAILED DESCRIPTION

Operation of many power converters (e.g., buck power converters, boost power converters, buck-boost power converters, etc.) of a power supply such as a SMPS may be at least partially dependent on a value of an output of that power converter. For example, if the output of the power converter is too low with respect to a reference voltage value (Vref), the power converter is controlled to turn on. Such control is performed, in at least some examples, by a controller (sometimes termed a power converter controller or a power controller). If the output of the power converter is too high with respect to Vref, the power converter is controlled to turn off. Similarly, operation of many power converters may be at least partially dependent on a value of an inductor current flowing in the power converter. For example, if a value of the inductor current is too low with respect to Vref during an off-time (TOFF) phase of the power converter, the power converter is controlled to turn on (such as in a valley current mode system). If the value of the inductor current is too high with respect to Vref during an on-time (TON) phase of the power converter, the power converter is controlled to turn off (such as in a peak current mode system). However, signals of the power converter and/or the inductor current are not always ideal signals that lack noise, spikes, valleys, and/or other non-ideal characteristics. In some examples, the inductor current includes leading edge noise. The leading edge noise is, for example, caused when a transistor of the power converter turns on and a large amount of current suddenly enters into the power converter through the transistor. When the large amount of current suddenly enters into the power converter, oscillation may occur at the leading edge of the inductor current (or a signal representative of the inductor current, such as a sense signal (Isense), resulting in leading-edge noise that may adversely affect stability and/or performance of the power converter and/or a system that includes the power converter.

In some circumstances, these non-ideal characteristics cause a controller that is monitoring and controlling the power converter to prematurely turn the power converter on or off (e.g., when the controller would not otherwise turn the power converter on or off in the absence of the non-ideal characteristics in a signal of the power converter). For example, as the controller controls a power transistor of the power converter to turn on and begin conducting energy, parasitic characteristics of the power converter may create a sudden and/or high value current pulse in the power converter. The current pulse is, in some examples, present in a current sense signal of the power converter that is monitored by the controller for controlling the power converter. In some circumstances, particularly when the power converter is operating at light load conditions (e.g., a load coupled to the power converter is drawing a small amount of current), an amplitude of the non-deal characteristics may exceed a switching threshold (e.g., an error signal (Verr)) for the controller to control the power converter (e.g., to turn a power transistor of the power converter on or off). In some examples, Verr is generated by a loop controller based at least partially on a comparison of a signal representative of on output signal (VOUT) of the power converter to Vref. In these circumstances, the premature controlling action performed by the controller may cause the power converter to provide insufficient current to the load or provide an excess amount of current that may negatively affect efficiency of the power converter.

In some examples, to prevent the premature controlling action of the controller, the non-ideal characteristics are mitigated in the signal of the power converter by blanking a portion of the signal in which the non-ideal characteristics occur. For example, the signal of the power converter is passed through a filter or a blanking pulse of a predetermined duration is added to the signal of the power converter. The predetermined duration and the filter coefficient of the filter may each vary as a result of component manufacturing process and operating temperature. During the predetermined duration, the signal of the power converter may be blanked such that the signal of the power converter is substantially equal to zero for the predetermined duration. Therefore, to ensure that the non-ideal characteristics are mitigated in the signal of the power converter, the predetermined duration or filter coefficient may be designed to satisfy minimum noise suppression requirements in either, or both, of amplitude and duration. However, such a blanking or filtering process that removes a portion of the signal of the power converter adversely affects efficiency of the power converter, such as at high frequencies of operation and light loads, or when the blanking results in extended on-times for the power converter. Furthermore, the blanking methodology may limit the duty cycle of the power converter (e.g., establish a minimum achievable duty cycle greater than otherwise achievable without the blanking method), further adversely affecting efficiency. These adverse effects to efficiency can include at least, for example, increased cost of operation and increased energy lost due to heat dissipation and/or switching losses of the power converter.

At least some aspects of the present disclosure include examples of a circuit that mitigates the non-ideal characteristics of the signal of the power converter. In at least some examples, leading edge noise in Isense (e.g., a signal representative of an inductor current of the power converter) is attenuated and/or filtered. A portion of the Isense subject to the attenuation and/or filtering is subsequently reconstructed from one or more generated current signals (e.g., current signals having positive and/or negative slopes of varying degrees and dependent on a value of an input signal (VIN) and a value of VOUT). In some examples, the filtering is progressively removed from the Isense as opposed to an abrupt end to the filtering that may potentially adversely affect the Isense. Reconstructing Isense after performing the attenuating and/or filtering, in at least one example, mitigates an amount of instantaneous current change (e.g., jump, drop, or other form of glitch) between the attenuated and/or filtered portion of Isense and the non-attenuated and/or filtered portion of Isense at a time of transition from the attenuated and/or filtered portion of Isense to the non-attenuated and/or filtered portion of Isense. The reconstruction of Isense is performed, for example, by generating one or more currents (e.g., based on any one or more of VIN, VOUT, Vref, Verr, a value associated with an inductor of the power converter, or any other suitable criteria) that emulate Isense and adding these generated currents to Isense during period of time that Isense is attenuated and/or filtered.

Figure 1:
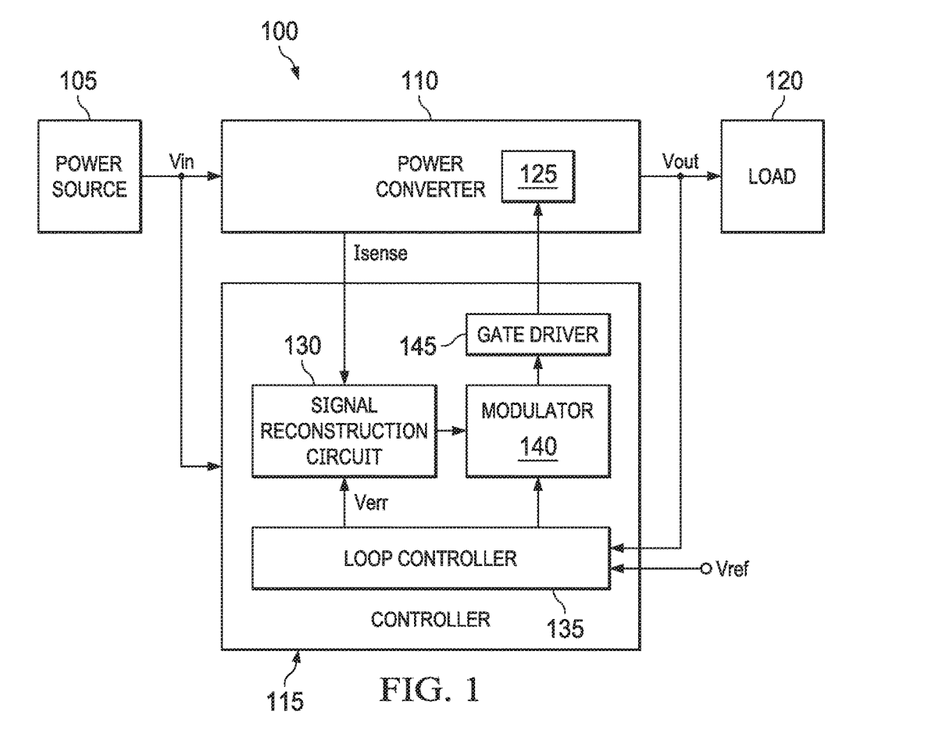
FIG. 1 shows a block diagram of an illustrative system in accordance with various embodiments.

Referring now to FIG. 1, a block diagram of an illustrative system 100 is shown. In at least one example, the system 100 is a power system that includes a power source 105, a power converter 110, and a controller 115. Both the power converter 110 and the controller 115 are configured to couple to a load 120. The power converter 110 and controller 115, in at least one example, form a SMPS that may incorporate the power source 105. The power source 105 is, for example, a battery of any suitable energy storage technology or chemical composition. In another example, the power source 105 is any other suitable device that provides a direct current (DC) signal to the system 100 at a suitable voltage level and conveying a suitable amount of current to power at least a portion of the system 100 and/or the load 120. The power converter 110 is, for example, any of a buck converter, a boost converter, a buck-boost converter, a hybrid converter, or any other suitable form of power converter, a scope of which is not limited herein. In at least one example, the power converter 110 includes a power transistor 125. Controlling the power transistor 125, in some examples, controls operation of the power converter 110 such that the power converter 110 is turned on when the power transistor 125 is controlled to conduct current and the power converter 110 is turned off when the power transistor 125 is controlled to not conduct current.

Each of the power converter 110 and the controller 115 is, in some examples, coupled to the power source 105. The controller 115 is further coupled to the power converter 110 (e.g., coupled to at least the power transistor 125) and the power converter 110 is configured to couple to the load 120. In various other examples, the controller 115 is coupled to the power converter 110 at one or more other locations, such as an output of the power converter 110, a sense element of the power converter 110, or any other location according to a desired operation of the controller 115 and/or topology of the power converter 110. For example, the controller 115 may be coupled to the power converter 110 at a sense element of the power converter 110 to receive Isense having a value indicative of a current flow in the power converter 110. In some examples, Isense is a signal indicative of (or bearing a relationship to) the current flow (e.g., current flowing through the power transistor 125) in the power converter 110. In at least some examples, Isense has a current indicative of the current flow in the power converter 110. In other examples, Isense has a voltage indicative of the current flow in the power converter 110. In one example, Isense is indicative of the current flow through the power transistor 125. When the power transistor 125 is conducting between its source and drain terminals (e.g., "turned on"), a voltage drop occurs across the source and drain terminals. The voltage drop is replicated across a sense element (e.g., a sense power transistor and/or a resistor (each not shown)) to sense the current. While one current sensing method is illustratively included herein, any suitable current sensing scheme is contemplated by the resent disclosure and included in the scope of the present disclosure.

In at least one example the controller 115 is a current mode controller comprising a signal reconstruction circuit 130, a loop controller 135, and a modulator 140. In some examples, the controller 115 further comprises a gate driver 145. In other examples, the gate driver 145 is implemented as a separate component that may be coupled to the controller 115. In some examples, the modulator 140, or a portion of the modulator 140, may be implemented as a component of the signal reconstruction circuit 130. In another example, Isense is a signal having a voltage representative of the current flow in the power converter 110. In some examples, Isense is attenuated prior to the controller 115 receiving Isense (in which case, examples described herein with respect to the controller 115 and Isense apply equally to the controller 115 and the attenuated representation of Isense).

In an example of operation of the system 100, the controller 115 controls the power converter 110 to generate an output signal (VOUT) based at least partially on an input signal (VIN) received by the power converter 110 from the power supply 105. For example, the controller 115 controls the power converter 110 by the gate driver 145 controlling the power transistor 125 to turn on and conduct energy or turn off and cease conducting energy, at least partially based on Isense. In another example, the controlling is performed at least partially based on VOUT. In various examples, the controller 115 further controls the power converter 110 according to other characteristics such as an inductor current of the power converter 110, Vref (e.g., to which the controller 115 compares at least one signal received from the power converter 110 to determine a control signal for controlling the power converter 110), or any other suitable criteria or characteristic for use in controlling the power converter 110. In at least some examples, when the controller 115 determines that a value of Isense reaches (e.g., as represented by a reconstructed signal VRAMP, reconstructed according to the operations of the present disclosure signal VRAMP) (e.g., received by the signal reconstruction circuit 130 from the loop controller 135), the controller 115 controls the power converter 110 to change operating modes. For example, when the system 100 is a peak current mode system, when the value of Isense increases to reach Verr, the controller 115 controls the power converter 110 to turn off (e.g., controls the power transistor 125 to stop conducting energy). When the system 100 is a valley current mode system, when the value of Isense is lower than Verr, in some examples the controller 115 controls the power converter 110 to turn on (e.g., controls the power transistor 125 to begin conducting energy). In some examples, the signal reconstruction circuit 130 receives Verr from the loop controller 135 as illustrated in FIG. 1. In other examples, the signal reconstruction circuit 130 receives Verr from another component, either shown or not shown, of the controller 115 (e.g., such as a compensator (not shown) of the controller 110). In yet other examples, the signal reconstruction circuit 130 receives Verr from a component outside of the controller 110 and coupled to the controller 110.

In some circumstances, parasitic characteristics of the power converter 110 (e.g., such as inherent capacitance, inductance, and/or resistance), characteristics of the system 100, and/or effects of the load 120 may cause fluctuations in the value of Isense that may cause the value of Isense to momentarily reach Verr but not maintain a value that is sufficient to remain beyond Verr. In other examples, an inrush current into the power converter 110 when the transistor 125 (or another transistor of the power converter 110 operating as a high-side transistor) is turned on may cause oscillation in a leading edge of Isense, creating leading edge noise (e.g., a momentary spike or valley). The momentary (e.g., sudden) spike or valley in Isense sometimes causes the value of Isense to exceed Verr and cause the controller 115 to control the power converter 110 to toggle from an on state to an off state or vice versa. The controller 115 controlling the power converter 110 to toggle in this manner may be premature because the value of Isense other than the momentary spike or valley may not be sufficient to reach Verr. The premature toggling of the power converter 110, in some examples, causes the power converter 110 to provide less current to the load 120 than the load 120 is attempting to draw from the power converter 110 and/or provide excess current that may be lost as radiated heat.

In at least one example, the controller 115 is configured to detect and mitigate momentary spikes or valleys in the value of Isense to prevent the premature toggling of the power converter 110 from the on state to the off state or vice versa. The controller 115 at least partially mitigates the momentary spikes or valleys in the value of Isense, in at least one example, via the signal reconstruction circuit 130. To at least partially mitigate the momentary spikes or valleys, in some examples the signal reconstruction circuit 130 attenuates and/or filters Isense (or further attenuates a previously attenuated signal representative of Isense). In at least some examples, the signal reconstruction circuit 130 further reconstructs at least a portion of Isense (e.g., a leading edge of Isense) for a period of time corresponding to a period of time during which the signal reconstruction circuit 130 performed the attenuation and/or filtering of Isense. In one example, the reconstruction may approximate and/or estimate (such as with a fixed slope signal or an adjustable slope signal based at least partially on VIN and/or VOUT) a value of Isense during the period of time without exactly (e.g., identically) reconstructing Isense.

Figure 2:
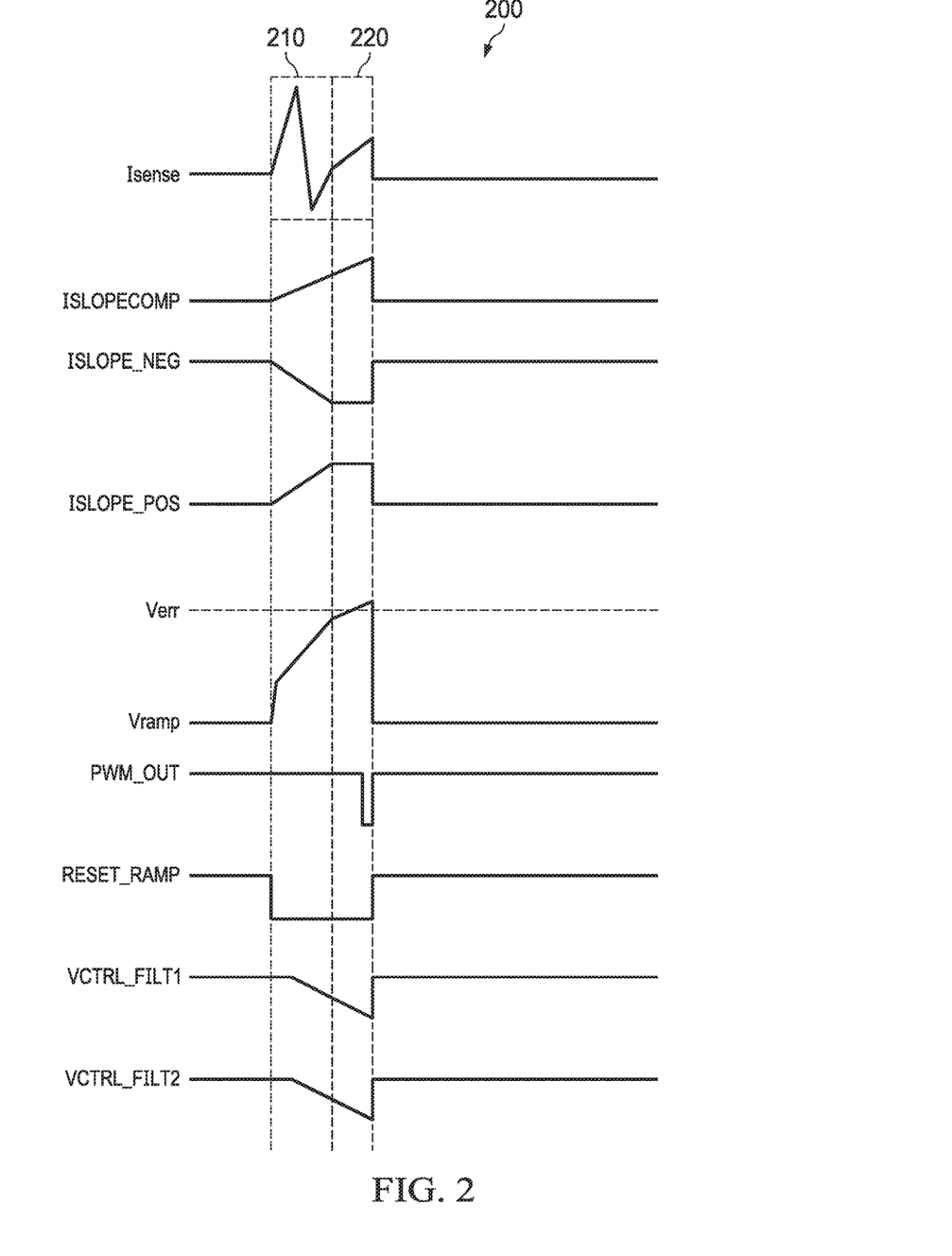
FIG. 2 shows a diagram of illustrative waveforms in a circuit in accordance with various embodiments.

Referring now to FIG. 2, a diagram 200 of illustrative waveforms in a circuit is shown. The diagram 200, in at least one example, is representative of at least some signals of the controller 115. As illustrated in diagram 200, in some examples Isense includes leading edge noise, illustrated as 210, and a remaining sensed current, illustrated as 220. For example, Isense can include one or both of a spike and/or a valley. In at least some examples, in a voltage representation of Isense, the spike or valley can prematurely exceed (e.g., prior to a second, later exceeding of) Verr such that operation of the circuit may be adversely effected, as discussed above.

To at least partially mitigate the spike and/or valley, a first current (ISLOPE_NEG) is subtracted from Isense and the resulting signal is filtered. The filtering is a progressive on controllable filtering such that a strength of the filtering changes over time as shown by the filter control signal VCTRL_FILT1. Subsequently, a second current (ISLOPE_POS) and third current (ISLOPECOMP) are added to the filtered signal to generate a reconstructed signal having a voltage representation indicated by VRAMP. The filtering is a progressive on controllable filtering such that a strength of the filtering changes over time as shown by the filter control signal VCTRL_FILT2. In some examples, ISLOPE_POS is a current having a predefined offset level and a positive slope, ISLOPE_NEG is a current having a predefined offset level and a negative slope, and ISLOPECOMP is a compensation current (e.g., slope compensation current) for preventing subharmonic oscillations in the circuit. ISLOPECOMP, in at least some examples, in any suitable compensation current generated by a slope compensation circuit and provided to a circuit of the present disclosure, the scope of which is not limited herein. In at least some examples, ISLOPECOMP is a positively sloping current. VRAMP is subsequently compared to Verr (e.g., by a comparator), and when VRAMP exceeds Verr, the output (PWM_OUT) of the comparator transitions from a logical high signal to a logical low signal until VRAMP no longer exceeds Verr. In at least some examples, RESET_RAMP controls operation of the system for which the signals of diagram 200 are representative. For example, when RESET_RAMP is a logical low signal, the system is in operation to provide the functions discloser herein. When RESET_RAMP is a logical high signal, the system is in a reset condition in which one or more nodes or components are discharged to ground to reset the system prior to beginning operation again.

Figure 3:
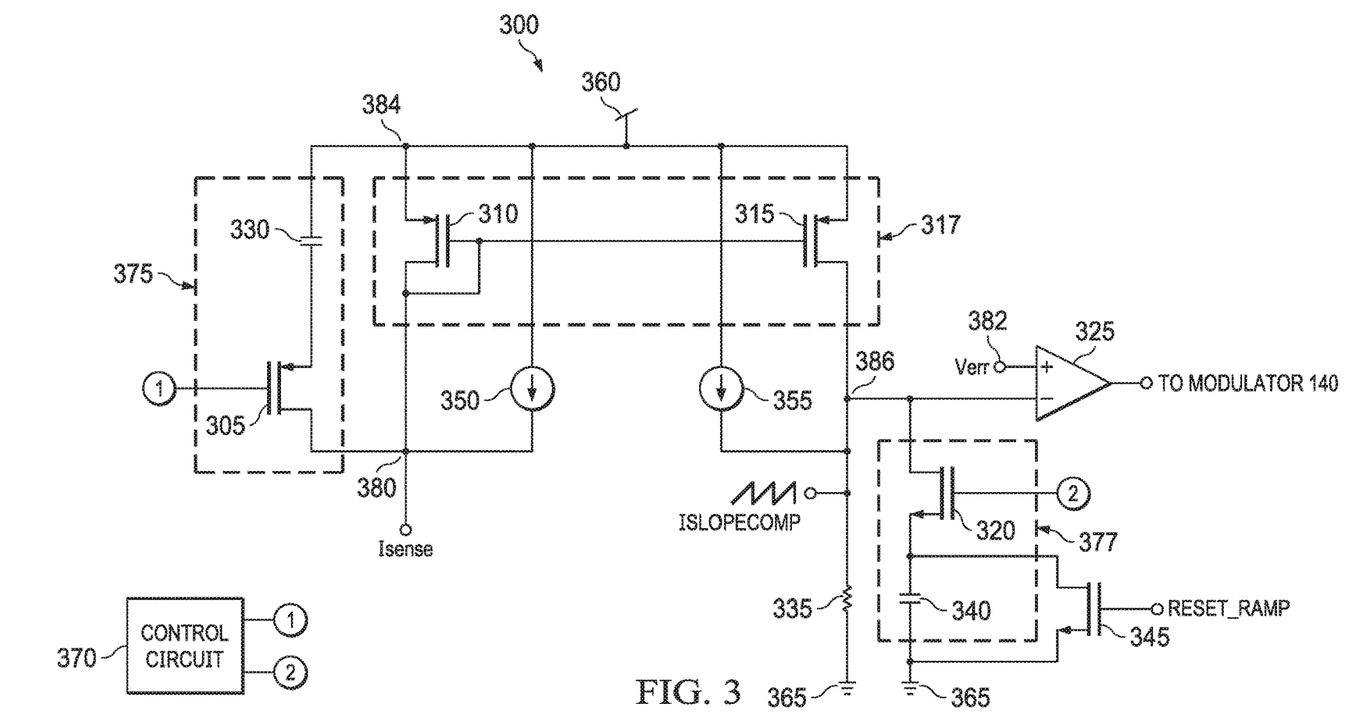
FIG. 3 shows a schematic diagram of an illustrative circuit in accordance with various embodiments.

Referring now to FIG. 3, a schematic diagram of an illustrative circuit 300 is shown. In at least one example, the circuit 300 is suitable for implementation as the signal reconstruction circuit 130 of the system 100, discussed above. In one example, at least some aspects of the circuit 300 are implemented on a same semiconductor die and/or in a same component package, while in other examples various components of the circuit 300 may be fabricated separately and configured to couple together. For example, at least some aspects of the circuit 300 may be fabricated separately and configured to couple together to perform the functionality of the circuit 300.

In one example, the circuit 300 includes a p-type metal oxide semiconductor field effect transistor (MOSFET) (PMOS) 305, a PMOS 310, a PMOS 315, a n-type MOSFET (NMOS) 320, and a comparator 325. In another example, the circuit 300 further includes, or is configured to couple to, a capacitor 330, a resistor 335, and a capacitor 340. The circuit 300 is further configured to couple to current sources 350 and 355, as well as a voltage source 360 and ground node 365. In various examples, the circuit 300 is further configured to couple to a control circuit 370 (e.g., at gate terminals of the PMOS 305 and the NMOS 320), configured to receive Isense at a node 380, and configured to receive Verr at a node 382.

The PMOS 305 has a drain terminal coupled to the node 380, a source terminal coupled to the voltage source 360 through the capacitor 330, and a gate terminal configured to couple to the control circuit 370 (e.g., to receive a control signal (Vctrl_filt1) for controlling the PMOS 305). The PMOS 310 has a drain terminal and a gate terminal coupled to the node 380 and a source terminal configured to couple to the voltage source 360. The current source 350 is configured to couple between the voltage source 360 and the node 380. The current source 355 is configured to couple between the voltage source 360 and a node 386. The PMOS 315 has a gate terminal coupled to the node 380, a source terminal configured to couple to the voltage source 360, and a drain terminal coupled to the node 386. The NMOS 320 has a drain terminal coupled to the node 386, a gate terminal configured to couple to the control circuit 370 (e.g., to receive a control signal (Vctrl_filt2) for controlling the NMOS 320), and a source terminal configured to couple to the ground node 365 through the capacitor 340. In at least some examples, the circuit 300 further includes a NMOS 345 coupled across the capacitor 340. The NMOS 345, in at least some examples, functions as a reset switch that clears the capacitor 340 of stored energy when the NMOS 345 is turned on. The resistor 335 is configured to couple between the node 386 and the ground node 365. The comparator 325 is configured to couple at a first terminal to the node 382 and is coupled at a second terminal to the node 386. In at least one example, the circuit 300 is further configured to receive a compensation current (e.g., a slope compensation current) at node 386.

In some examples, any one or more of the current source 350 and/or the current source 355 are implemented as standalone (e.g., discrete) devices that operate as a current source. In other examples, any one or more of the current source 350 and/or the current source 355 are nodes of a circuit (e.g., such as the control circuit 370) at which a signal is taken as the current source 350 and/or the current source 355.

In an example of operation of the circuit 300, Isense is received at node 380 and a current received from the current source 350 is subtracted from node 380. The current present at the node 380 is further filtered by the capacitor 330. For example, the PMOS 305 is configured to control coupling of the capacitor 330 to the node 380. Accordingly, in at least one example, the PMOS 305 and the capacitor 330 form a filter 375. By controlling a voltage present at the gate terminal of the PMOS 305 (e.g., such as the control circuit 370 controlling the voltage present at the gate terminal of the PMOS 305), the capacitor 330 can be selectively coupled to, or decoupled from, the node 380. In this way, the capacitor 330 may be coupled via the PMOS 305 to the node 380 at a rising edge of Isense to filter at least some of a momentary spike or valley present in Isense at, or near, a rising edge of Isense and may be decoupled from the node 380 subsequent to the rising edge of Isense. In one example, by gradually increasing or decreasing a value of the signal received at the gate terminal of the PMOS 305 with respect to a threshold voltage for turning on and/or off the PMOS 305, an amount of filtering by the capacitor 330 of the current present at node 380 is decreased or increased, respectively, to facilitate smooth transitions between filtering and no filtering.

The filtered current present at node 380 is mirrored to node 386 via the PMOS 310 and the PMOS 315. In at least one example, the PMOS 310 and the PMOS 315 are collectively referred to as a current mirror 317 configured to approximately mirror (e.g., replicate) a current present at node 380 to node 386. A current received from the current source 355 and, optionally, a slope compensation current, are further added to node 386 and the current present at the node 386 is filtered by the capacitor 340. For example, the NMOS 320 is configured to control coupling of the capacitor 340 to the node 386. Accordingly, in at least one example, the NMOS 320 and the capacitor 340 form a filter 377. By controlling a voltage present at the gate terminal of the NMOS 320 (e.g., such as the control circuit 370 controlling the voltage present at the gate terminal of the NMOS 320), the capacitor 340 can be selectively coupled to, or decoupled from, the node 386. In this way, the capacitor 340 may be coupled via the NMOS 320 to the node 386 at a rising edge of Isense to filter at least some discontinuities in the current present at node 386 as a result of the filtering by capacitor 330, the subtraction of current from the current source 350, and/or the addition of current from the current source 355. Capacitor 340 filters the current present at node 386, in one example, at, or near, a leading edge of Isense and is decoupled from the node 386 subsequent to the leading edge of Isense. In one example, by gradually increasing or decreasing a value of the signal received at the gate terminal of the NMOS 320 with respect to a threshold voltage for turning on and/or off the NMOS 320, an amount of filtering by the capacitor 340 of the current present at node 386 is increased or decreased, respectively, to facilitate smooth transitions between filtering and no filtering. In at least one example, the capacitor 340 is discharged (e.g., cleared) at the beginning of each cycle (e.g., clock cycle of the circuit 300 or switching cycle of a power converter from which Isense is measured) prior to filtering the current present at node 386. The capacitor 340 is discharged, in one example, when a reset signal (e.g., RESET_RAMP) causes the NMOS 345 to turn on and provide a discharge path to ground from the capacitor 340.

The comparator 325 receives a voltage signal (e.g., VRAMP) present at node 386 (e.g., where a value of the voltage signal is determined according to a value of resistance of the resistor 335 multiplied by a current flowing through the resistor 335) and compares the voltage signal present at node 386 to Verr. The output of the comparator 325 is, in some examples, provided to the modulator 140 (e.g., when the circuit 300 is implemented as the signal reconstruction circuit 130) at least partially for use in controlling a gate driver to control a power converter. In other examples, the output of the comparator 325 is provided to any other suitable circuit such as a digital logic circuit, a loop control, the gate driver, or the like. The output of the comparator 325 indicates a difference between Verr and Vramp, where Vramp is representative of the Isense, filtered to remove a momentary spike or valley at a leading edge of Isense and reconstructed during the filtering period to approximate Isense in the absence of the momentary spike or valley. For example, when Vramp is less than Verr, an output of the comparator 325 is a logic level one (e.g., a logical high signal). When Vramp is equal to, or greater than, Verr, the output of the comparator 325 is a logic level zero (e.g., a logical low signal). While illustrated and discussed herein as a component of the circuit 300, in some examples, the comparator 325 is instead a component of modulator 140 and is configured to couple to the circuit 300.

Figure 4A:
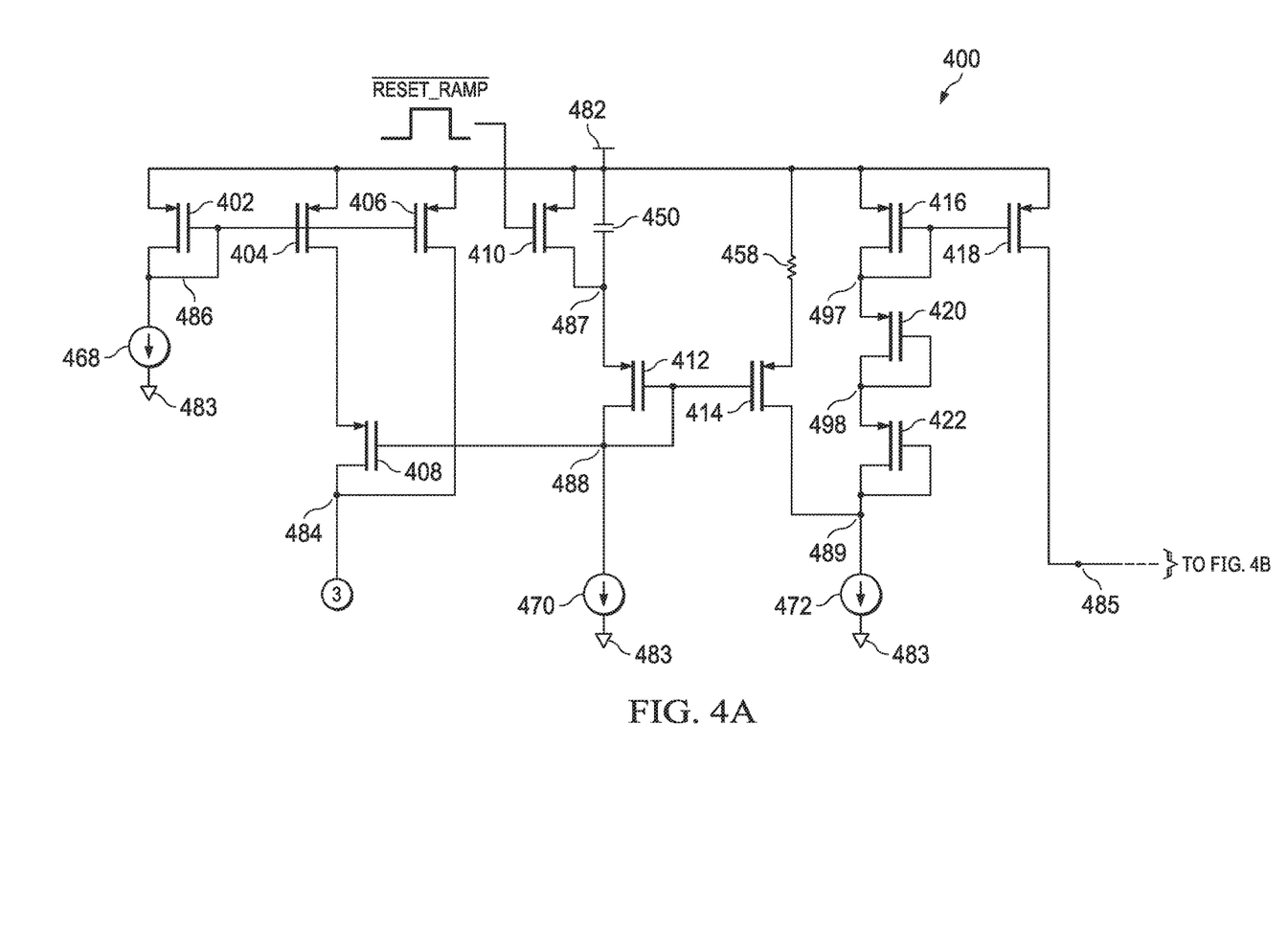
FIG. 4A shows a partial schematic diagram of an illustrative circuit in accordance with various embodiments.
Figure 4B:
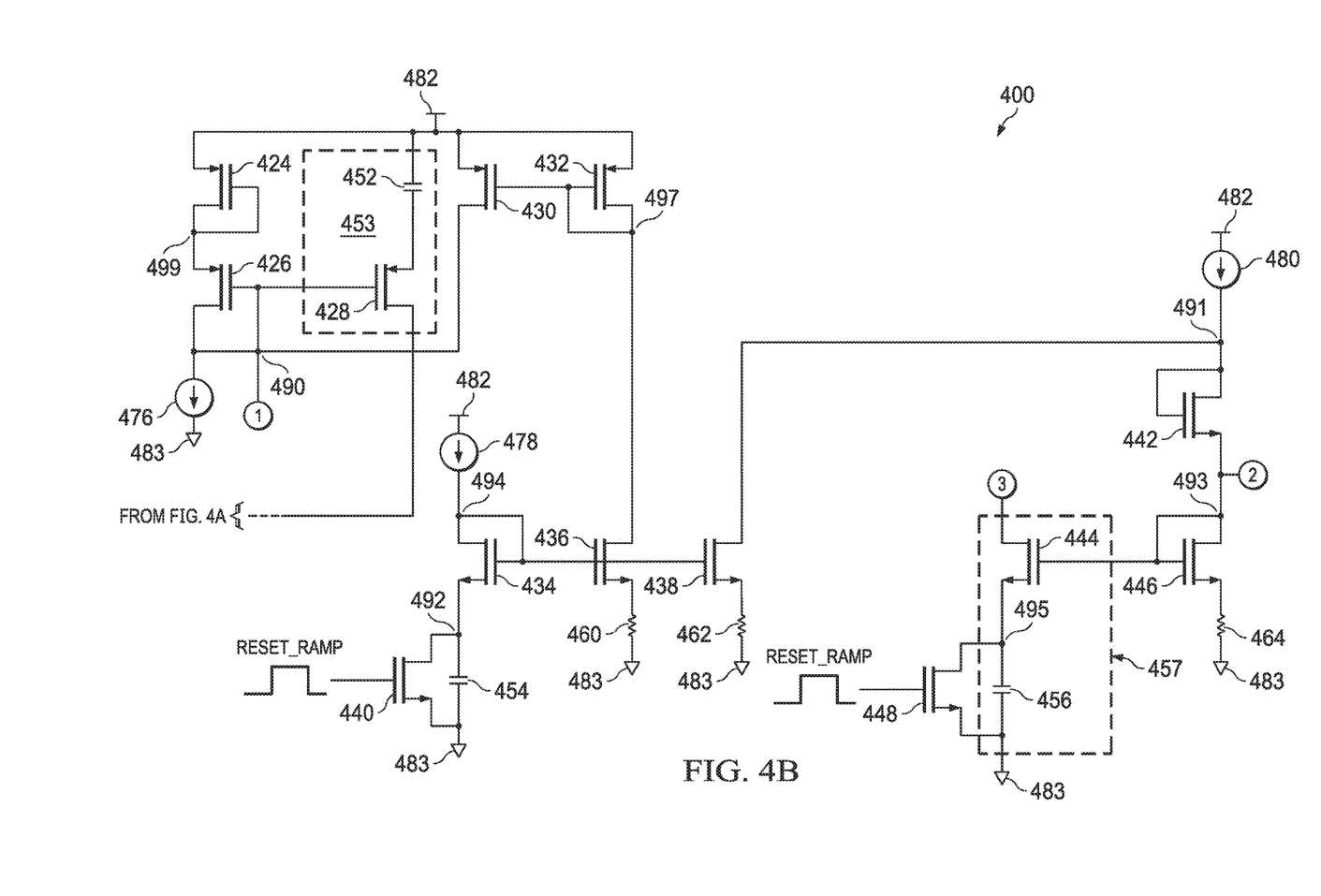
FIG. 4B shows a partial schematic diagram of an illustrative circuit in accordance with various embodiments.

Referring now to FIGS. 4A and 4B, a schematic diagram of an illustrative circuit 400 is shown. In at least one example, the circuit 400 is suitable for implementation as the control circuit 370 of the circuit 300, discussed above. In one example, at least some aspects of the circuit 400 are implemented on a same semiconductor die and/or in a same component package with one another and/or with the circuit 300, while in other examples various components of the circuit 400 may be fabricated separately and configured to couple together and/or with the circuit 300. For example, at least some aspects of the circuit 400 may be fabricated separately and configured to couple together to perform the functionality of the circuit 400.

In one example, the circuit 400 includes a PMOS 402, PMOS 404, PMOS 406, PMOS 408, PMOS 410, PMOS 412, PMOS 414, PMOS 416, PMOS 418, PMOS 420, PMOS 422, PMOS 424, PMOS 425, PMOS 428, PMOS 430, PMOS 432, NMOS 434, NMOS 436, NMOS 438, NMOS 440, NMOS 442, NMOS 444, NMOS 446, and NMOS 448. The circuit 400 further includes, or is configured to couple to, capacitor 450, capacitor 452, capacitor 454, capacitor 456, resistor 458, resistor 460, resistor 462, and resistor 464. The circuit 400 is further configured to couple to a current source 468, a current source 470, a current source 472, a current source 476, a current source 478, a current source 480, a voltage source 482, and a ground node 483.

An example architecture of the circuit 400 will now be described. In the example, the PMOS 402 has a source terminal coupled to the voltage source 482 and a drain terminal and a gate terminal coupled to a node 486. The PMOS 404 has a gate terminal coupled to the node 486, a source terminal coupled to the voltage source 482, and a drain terminal coupled to a source terminal of the PMOS 408. The PMOS 406 has a gate terminal coupled to the node 486, a source terminal coupled to the voltage source 482, and a drain terminal coupled to the node 484. The PMOS 408 has a source terminal coupled to the drain terminal of the PMOS 406, a drain terminal coupled to the node 484, and a gate terminal coupled to the node 488. The PMOS 410 has a source terminal coupled to the voltage source 482, a drain terminal coupled to a node 487, a gate terminal configured to receive a reset signal (or an inverse of the reset signal). The PMOS 412 has a source terminal coupled to the node 487, a drain terminal coupled to the node 488, and a gate terminal coupled to the node 488. The PMOS 414 has a gate terminal coupled to the node 488, a source terminal coupled to the voltage source 482 through the resistor 458, and a drain terminal coupled to a node 489. The PMOS 416 has a source terminal coupled to the voltage source 482 and a gate terminal and a drain terminal coupled to a node 497. The PMOS 418 has a source terminal coupled to the voltage source 482, a drain terminal coupled to the node 485, and a gate terminal coupled to a node 497. The PMOS 420 has a source terminal coupled to the node 497 and a gate terminal and a drain terminal coupled to the node 498. The PMOS 422 has a source terminal coupled to a node 498 and a gate terminal and a drain terminal coupled to the node 489.

The PMOS 424 has a source terminal coupled to the voltage source 482 and a gate terminal and a drain terminal coupled to a node 499. The PMOS 426 has a source terminal coupled to the node 499 and a gate terminal and a drain terminal coupled to a node 490. The PMOS 428 has a gate terminal coupled to the node 490, a source terminal coupled to the voltage source 482 through the capacitor 452, and a drain terminal coupled to the node 485. The PMOS 430 has a source terminal coupled to the voltage source 482, a drain terminal coupled to the node 490, and a gate terminal coupled to the node 497. The PMOS 432 has a source terminal coupled to the voltage source 482 and a gate terminal and a drain terminal coupled to the node 497. The NMOS 434 has a gate terminal and a drain terminal coupled to the node 494 and a source terminal coupled to the node 492. The NMOS 436 has a drain terminal coupled to the node 497, a gate terminal coupled to the node 494, and a source terminal coupled to the ground node 483 through the resistor 460. The NMOS 438 has a drain terminal coupled to the node 491, a gate terminal coupled to the node 494, and a source terminal coupled to the ground node 483 through the resistor 462. The NMOS 440 has a drain terminal coupled to the node 492, a source terminal coupled to the ground node 483, and a gate terminal configured to receive a reset signal (or an inverse of the reset signal). The NMOS 442 has a drain terminal and a gate terminal coupled to the node 491 and a source terminal coupled to a node 493. The NMOS 444 has a drain terminal coupled to the node 484, a gate terminal coupled to the node 493, and a source terminal coupled to a node 495. The NMOS 446 has a drain terminal and a gate terminal coupled to the node 493 and a source terminal coupled to the ground node 483 through the resistor 464. The NMOS 448 has a drain terminal coupled to the node 495, a source terminal coupled to the ground node 483, and a gate terminal configured to receive a reset signal (or an inverse of the reset signal).

The capacitor 450 is configured to couple between the voltage source 482 and the node 487. The capacitor 454 is configured to couple between the node 492 and the ground node 483. The capacitor 456 is configured to couple between the node 495 and the ground node 483. The current source 468 is configured to couple between the node 486 and the ground node 483. The current source 470 is configured to couple between the node 488 and the ground node 483. The current source 472 is configured to couple between the node 489 and the ground node 483. The current source 476 is configured to couple between the node 490 and the ground node 483. The current source 478 is configured to couple between the voltage source 482 and the node 494. The current source 480 is configured to couple between the voltage source 482 and the node 491.

In at least one example, one or more signals present in the circuit 400 function as one or more of the current source 350 and/or the current source 355 of the circuit 300, discussed above with respect to FIG. 3, and control one or more of the PMOS 305 and/or the NMOS 320, also discussed above with respect to FIG. 3. For example, a current present at node 485 (e.g., flowing through node 485) functions as the current source 350 such that the current present at node 485 is combined with (e.g., added to, or subtracted from) a current present at node 380 of FIG. 3. Similarly, a current present at node 484 (e.g., flowing through node 484) functions as the current source 355 such that the current present at node 485 is combined with a current present at node 386 of FIG. 3. Additionally, a signal present at node 490 is provided to the gate terminal of the PMOS 305 such that the signal present at node 490 controls coupling and decoupling of the capacitor 330 from the node 380 in FIG. 3. Similarly, a signal present at node 493 is provided to the gate terminal of the NMOS 320 such that the signal present at node 493 controls coupling and decoupling of the capacitor 340 from the node 386 in FIG. 3.

In at least one example, the capacitor 452 corresponds to the capacitor 330 of FIG. 3, the PMOS 428 corresponds to the PMOS 305 of FIG. 3, the capacitor 456 corresponds to the capacitor 340 of FIG. 3, and the NMOS 444 corresponds to the NMOS 320 of FIG. 3. The respective components (capacitor 452, capacitor 456, PMOS 428, and NMOS 444) are illustrated again in FIG. 4 for the sake of clarity and ease of understanding of interaction between the circuit 400 and the circuit 300 of FIG. 3. Accordingly, in at least one example, the PMOS 428 and the capacitor 452 form a filter 453 corresponding to the filter 375 of FIG. 3. Similarly, in at least one example, the NMOS 444 and the capacitor 456 form a filter 457 corresponding to the filter 377 of FIG. 3. In some examples, the circuit 400 does not include any one or more of the PMOS 428, the NMOS 444, the capacitor 452, and/or the capacitor 456 and instead is configured to couple to one or more of the PMOS 305, the NMOS 320, the capacitor 330, and/or the capacitor 340, each illustrated in FIG. 3, according to the correspondences disclosed above.

In an example of operation of the circuit 400, the circuit 400 generates one or more of ISLOPE_NEG, ISLOPE_POS, VCTRL_FILT1, and/or VCTRL_FILT2 signals, as discussed above. The current source 470 and the current source 478, in at least one example, provide a bias current (Ibias) having a substantially equal value. In some examples, Ibias is a fixed value, while in other examples, Ibias is adjustable. In at least one example, each of the current source 470 and the current source 478 comprises a transconductance amplifier (e.g., a high linearity transconductance amplifier) configured to generate Ibias such that Ibias is present at an output of the transconductance amplifier. The current source 470 and the current source 478 each generate Ibias, in one example, based on VIN and VOUT, where Ibias is approximately equal to a gain value of the transconductance amplifier multiple by a difference between VIN and VOUT. The gain value of the transconductance amplifier is set, for example, such that a slope of a voltage ramp of a capacitor receiving Ibias is approximately equal to a rising slop of Isense. In at least one example, the gain value of the transconductance amplifier is at least partially dependent on an inductance value of an inductor from which Isense is measured. In another example, the current source 470 and/or the current source 478 each provide constant current outputs that are not dependent on VIN or VOUT.

In one example, the PMOS 402 and the PMOS 404 create a current mirror that approximately mirrors a current from the current source 468 to a drain terminal of the PMOS 404 and source terminal of the PMOS 408. As a value of node 488 is pulled low beneath a threshold for turning on the PMOS 408, the PMOS 408 begins conducting and the mirrored current is passed to node 484 for use as ISLOPE_POS. When the PMOS 408 fully turns on (e.g., reaches a saturation mode of operation and/or has overhead to provide overdrive for the PMOS 404), ISLOPE_POS reaches a maximum value and remains at that maximum value until the circuit 400 is reset. The circuit 400 is reset, for example, at the end of each switching cycle of a power converter from which Isense is measured. In another example, the circuit 400 is a clocked circuit (e.g., RESET_RAMP is a clock signal), and the circuit 400 is reset each clock cycle. The circuit 400 is reset, in at least one example, by asserting a reset signal (e.g., RESET_RAMP or an inverse of RESET_RAMP) at the gate terminals of the PMOS 410, NMOS 440, and NMOS 448 to clear (e.g., discharge) nodes 487, 492, and 495 of their prior values (e.g., prior values resulting from prior operation of the circuit 400).

When the PMOS 410 is turned off (e.g., not conducting current, such as when the circuit 400 is not in a reset condition and RESET_RAMP is a logical low value), the capacitor 450 operates substantially as an integrator. As current flows into the capacitor 450, the integration pushes a value present at node 488 lower such that the PMOS 408 is turned on to generate ISLOPE_POS, as discussed above, and the PMOS 414 is turned on. When the PMOS 414 is turned on, a voltage across the resistor 458, and a current flowing through the resistor 458, each increase. The current source 472, in at least some examples, provides a fixed value bias current. In such examples, as the current through the resistor 458 (and correspondingly through the PMOS 414) increases, current flowing through the PMOS 416, 420, and 422 decreases in an approximately equal but opposite amount as the increase in current through the resistor 458. In one example, the PMOS 416 and the PMOS 418 create a current mirror that approximately mirrors a current from the node 497 to the node 485 to generate ISLOP_NEG.

In at least some examples, the current source 476 provides another fixed value bias current that biases the PMOS 424 and the PMOS 426 and setting a voltage of gate terminals of the PMOS 426 and PMOS 428. In one example, at the beginning of a cycle (e.g., clock cycle of the circuit 400 or switching cycle of a power converter from which Isense is measured), the PMOS 426 bias the PMOS 428 to cause the PMOS 428 to fully turn on and couple the capacitor 452 to node 485. The PMOS 428, in some examples, couples the capacitor 452 to (and/or decouples the capacitor 452 from) node 485 to enable the capacitor 452 to filter the current present at node 485. For example, based on a value present at node 490, an amount of current flowing through the PMOS 428 (and, correspondingly, the capacitor 452), and thereby an amount of filtering provided by the capacitor 452, is controlled. When the capacitor 452 is coupled to node 485 through the PMOS 428, the capacitor 452 filters, in at least one example, noise (such as leading edge noise) from a signal present at node 485. In at least one example, an amount of filtering performed by the capacitor 452 is controlled by the signal VCTRL_FILT1, for example, based on a value of VCTRL_FILT1 present at node 490 and thereby the gate terminal of the PMOS 428. VCTRL_FILT1 is generated, in one example, by the current mirror of PMOS 430 and PMOS 432. As current flowing through the PMOS 430 increases, current flowing through the PMOS 424 and the PMOS 426 decreases, decreasing a voltage present at the gate terminal of the PMOS 428. As the voltage present at the gate terminal of the PMOS 428 decreases, the capacitor 452 is decoupled from node 485 to remove the filtering of capacitor 452 from the circuit 400.

In at least one example, the current source 478 provides a fixed value bias current. In this example, the current source 478 provides an adjustable value bias current. A slope of VCTRL_FILT1, in some examples, is approximately equal to a value of the current provided by the current source 478 (such as Ibias, as discussed above) divided by a value of the capacitance of capacitor 454. At a beginning of a cycle, the NMOS 440 does not conduct and current from the current source 478 flows through the NMOS 434 and capacitor 454, causing the voltage at node 492 to increase. The increase in voltage at node 492 increases the voltage present at source and gate terminals of the NMOS 434. The increase in voltage at the source and gate terminals of the NMOS 434 correspondingly increases the voltage present at gate terminals of the NMOS 436 and NMOS 438, increasing current flow through the resistor 460 and the resistor 462. In at least one example, the current flowing through the resistor 460 (and thereby present at node 497) is mirrored to the node 490 to generate VCTRL_FILT1.

In one example, the current flowing through the resistor 462 is subtracted from a fixed value bias current provided by the current source 480 and present at node 491. A remaining current present at node 491 flows through the NMOS 442, NMOS 446, and resistor 464. In at least one example, a voltage present at node 493 sets causes the NMOS 444 to be turned on at the beginning of each cycle In at least one example, the NMOS 446 and the NMOS 444 form a current mirror that approximately mirrors a signal present at node 493 to node 495. As the current flowing through the NMOS 438 increases, a voltage present at the gate terminals of the NMOS 444 and the NMOS 446 decreases at least partially as a result of decreased current flow through the resistor 464 and present at node 493. As the voltage present at the gate terminal of the NMOS 444 decreases, the capacitor 456 is progressively decoupled by NMOS 444 from node 484 to remove the filtering of the capacitor 456 from node 484.

Figure 5:
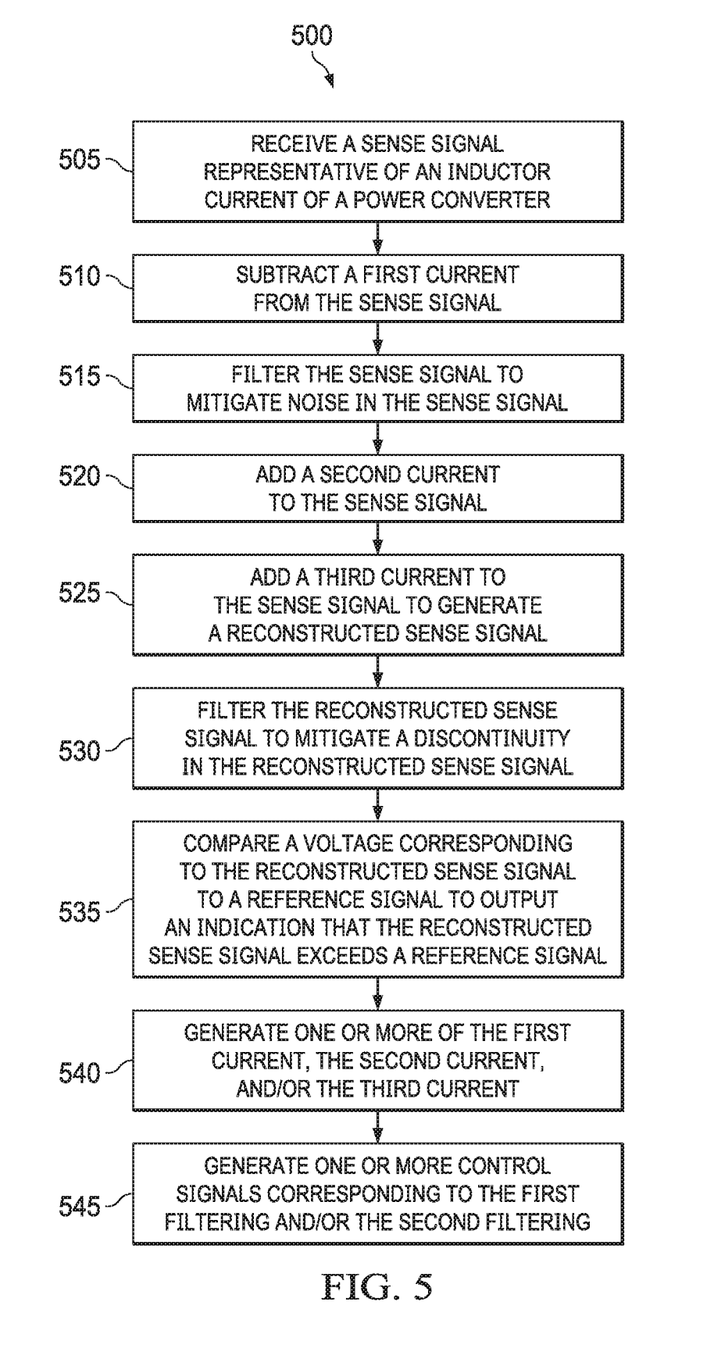
FIG. 5 shows a flowchart of an illustrative method of signal reconstruction in accordance with various embodiments.

Referring now to FIG. 5, a flowchart of an illustrative method 500 of signal reconstruction is shown. In one example, at least some aspects of the method 500 are implemented by at least one circuit, such as the circuit 300 and/or the circuit 400, discussed above with reference to FIGS. 3 and 4, respectively. The method 500 is implemented, in one example, to attenuate (e.g., filter) momentary spikes and/or valleys in a signal and reconstruct a portion of the signal during a period of time during which the attenuation occurs to form a reconstructed signal. While discussed herein as spikes or valleys in a current signal, at least some aspects of the present disclosure equally apply to spikes or valleys in a voltage signal.

At operation 505, the circuit receives a sense signal representative of an inductor current of a power converter. In at least one example, the sense signal is a current signal having a current value representative of the inductor current. In another example, the sense signal is a voltage signal having a voltage value representative of the inductor current.

At operation 510, the circuit subtracts a first current from the sense signal. The first current is, for example, a negative sloping signal having a starting value of approximately a DC offset of the sense signal and decreasing substantially linearly to zero. In some example, the first current is internally generated (e.g., at least partially on a same semiconductor die and/or in a same IC package), while in other examples the first current is received by the circuit from an external device.

At operation 515, the circuit filters the sense signal to mitigate (e.g., filter, attenuate, remove, etc.) noise in the sense signal. In at least one example, the circuit filters the sense signal at a rising or leading edge of the sense signal and does not filter the sense signal for an entire duration of the sense signal. The circuit filters the sense signal, for example, using a filtering capacitor. In at least one example, the filtering capacitor is progressively decoupled from the circuit to remove effects of the filtering capacitor on the circuit subsequent to the rising or leading edge of the sense signal.

At operation 520, the circuit adds a second current to the sense signal. The second current is, for example, a slope compensation current that increases substantially linearly beginning at zero. In some example, the second current is internally generated (e.g., at least partially on a same semiconductor die and/or in a same IC package), while in other examples the second current is received by the circuit from an external device.

At operation 525, the circuit adds a third current to the sense signal to generate a reconstructed sense signal. The third current is, for example, a signal having a positive slope and starting value of zero and increasing substantially linearly and converging to a value of the sense signal. In at least one example, adding the third current to the sense signal reconstructs the sense signal to have a value approximately equal to an expected value of the sense signal, but for the leading edge noise. In some example, the third current is internally generated (e.g., at least partially on a same semiconductor die and/or in a same IC package), while in other examples the third current is received by the circuit from an external device.

At operation 530, the circuit filters the reconstructed sense signal to mitigate (e.g., filter, attenuate, remove, etc.) a discontinuity in the reconstructed sense signal resulting from any one or more of operations 510 through 525 (e.g., a discontinuity between a reconstructed portion of the reconstructed sense signal and an original portion of the reconstructed sense signal). In at least one example, the circuit filters the sense signal at a rising or leading edge of the sense signal and does not filter the sense signal for an entire duration of the sense signal. The circuit filters the sense signal, for example, using a second filtering capacitor. In at least one example, the second filtering capacitor is progressively decoupled from the circuit to remove effects of the second filtering capacitor on the circuit subsequent to generating the reconstructed the sense signal.

Optionally, the method 500 further includes operation 535. At operation 535, the circuit compares a voltage corresponding to the filtered reconstructed sense signal to Verr and outputs an indication when a value of the filtered reconstructed sense signal exceeds a value of Verr. The circuit compares the voltage corresponding to the filtered reconstructed sense signal to Verr, in at least one example, using a comparator.

Optionally, the method further includes operation 540. At operation 540, the circuit generates one or more of the first current, the second current, and/or the third current for subtraction from, or addition to, the sense signal to form the reconstructed sense signal. The circuit generates one or more of the first current, the second current, and/or the third current according to one or more combinations of transistors, capacitors, current sources, voltage sources, and/or resistors, a scope of which is not limited herein.

Optionally, the method further includes operation 545. At operation 545, the circuit generates one or more control signals corresponding to the filtering capacitor and/or the second filtering capacitor. The control signals, for example, control coupling and decoupling the filtering capacitor and/or the second filtering capacitor from the circuit. The circuit generates the one or more control signals according to one or more combinations of transistors, capacitors, current sources, voltage sources, and/or resistors, a scope of which is not limited herein.

While the operations of the method 500 have been discussed and labeled with numerical reference, each of the operations of the method 500 may include additional operations that are not recited herein, any one or more of the operations recited herein may include one or more sub-operations, any one or more of the operations recited herein may be omitted, and/or any one or more of the operations recited herein may be performed in an order other than that presented herein (e.g., in a reverse order, substantially simultaneously, overlapping, etc.), all of which is intended to fall within the scope of the present disclosure.

Figure 6:
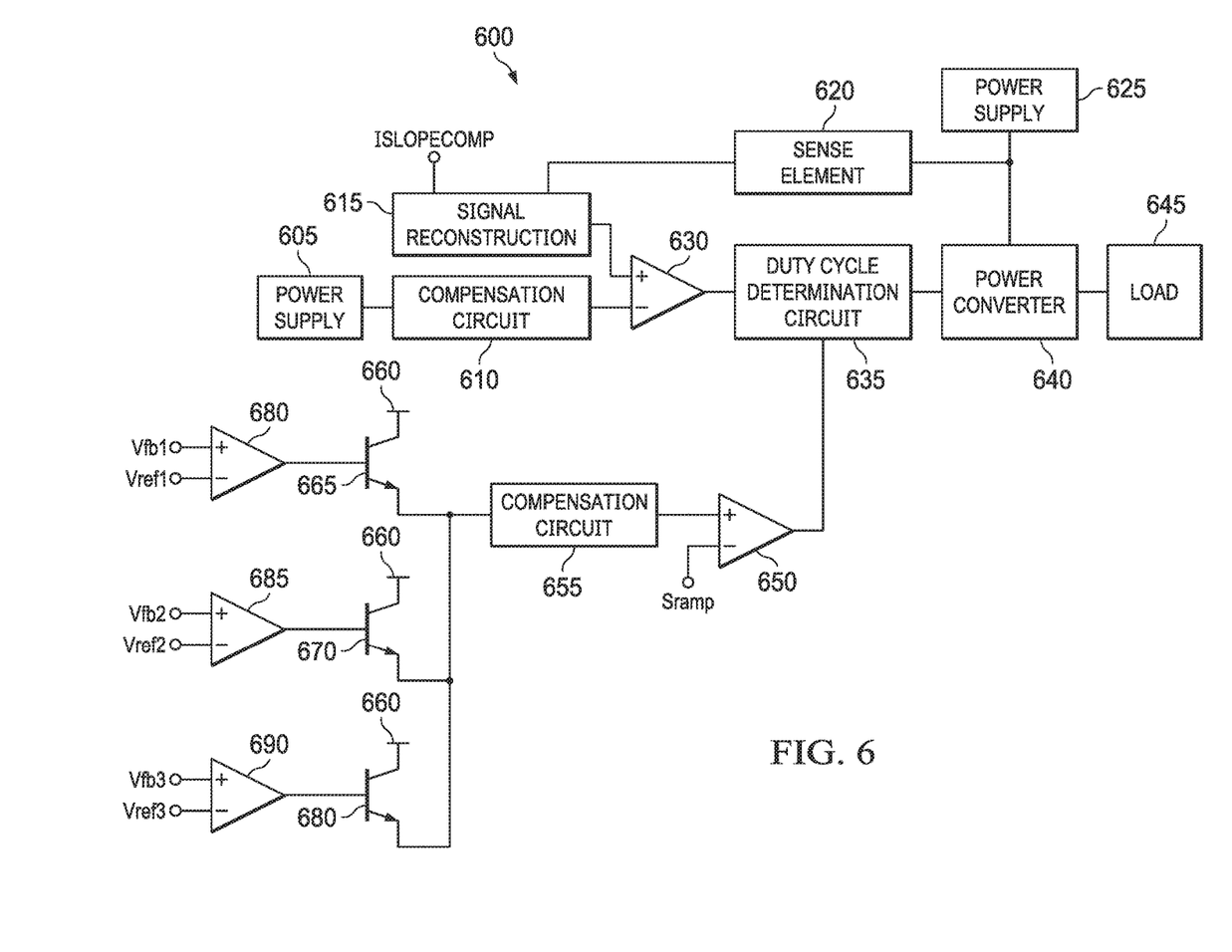
FIG. 6 shows a schematic diagram of an illustrative circuit in accordance with various embodiments.

Turning now to FIG. 6, a schematic diagram of an illustrative circuit 600 is shown. In at least one example, the circuit 600 illustrates an application environment for implementing the signal reconstruction circuit 130 of FIG. 1 (and/or the circuit 300 of FIG. 3 or circuit 400 of FIG. 4). In some examples, the circuit 600 illustrates a charger (e.g., a battery charger) configured to provide power to a load. In at least one example architecture, the circuit 400 includes a compensation circuit 610, a slope compensation circuit 615, a comparator 630, a duty cycle determination circuit 635, a comparator 650, a compensation circuit 655, a transistor 665, a transistor 670, a transistor 675, an amplifier 680, a comparator 685, and a comparator 690. In some examples, the circuit 600 further includes, or is configured to couple to, a power converter 640, and a sense element 620. In some examples, the circuit 600 is further configured to couple to a power supply 605 and a power supply 625. In yet other examples, the power supply 605 and the power supply 625 are implemented as a single power supply and, in some examples, the circuit 600 includes one or more power regulation circuits (not shown) configured to generate one or more signals having a voltage value varied (e.g., modified) from a voltage value of a signal output by the single power supply. In at least some examples, the circuit 600 is further configured to couple to a load 645 (e.g., via the power converter 640).

In some examples, the compensation circuit 610 is configured to couple at an input to the power supply 605 and, in some examples, is configured to receive a reference signal (not shown). The compensation circuit 610 is, in some example architectures, a Type-II compensation circuit configured to provide stability enhancement to the circuit 600 (e.g., by introducing poles and/or zeroes into a signal received from the power supply 605), the scope of which is not limited herein. An output of the compensation circuit 610 is coupled to a second input of the comparator 630. The slope compensation circuit 615, in some examples, is configured to receive ISLOPECOMP at a first input and an output of the sense element 620 at a second input. In other examples, though not shown, the slope compensation circuit 615 is further configured to receive additional signals (such as other signals discussed herein with respect to any of the preceding figures). An output of the slope compensation circuit 615 is coupled to a first input of the comparator 630. An output of the comparator 630 is coupled to a first input of the duty cycle determination circuit 635. An output of the duty cycle determination circuit 635 is, in some examples, coupled to the power converter 640 and configured to control the power converter 640. In other examples, the output of the duty cycle determination circuit 635 is coupled to a gate driver (not shown) or a power converter controller (not shown) configured to couple to and control the power converter 640 based on one or more signals received from the duty cycle determination circuit 635.

In some examples, the power converter 640 is configured to couple to the power supply 625 and the sense element 620 has an input coupled to the coupling between the power supply 625 and the power converter 640. The sense element 620 is any suitable element for generating a signal indicative of a current flowing from the power supply 625 to the power converter 640, the scope of which is not limited herein. The power converter 640 is further configured to couple to the load 645 to provide power to the load 645, for example, from the power supply 625 modified based on a signal received from the duty cycle determination circuit 635.

In at least some examples, an output of the comparator 650 is coupled to a second input of the duty cycle determination circuit 635. A first input of the comparator 650 is coupled to an output of the comparison circuit 655. A second input of the comparator 650 is configured to receive a voltage slope compensation signal (Sramp). The Sramp signal is, in some examples, a signal having waveform shape of a saw-tooth with a fixed slope (e.g., a fixed-ramp signal) based at least partially on a desired gain and/or noise sensitivity of at least a portion of the circuit 600 (e.g., of the comparator 650). The compensation circuit 655 is, in some example architectures, a Type-III compensation circuit configured to provide stability enhancement to the circuit 600 (e.g., by introducing poles and/or zeroes into a signal received at an input to the compensation circuit 655), the scope of which is not limited herein.

In some examples, the compensation circuit 655 is coupled at an input to emitter terminals of each of the transistor 665, transistor 670, and transistor 675. Accordingly, in at least some examples, each of the transistor 665, transistor 670, and transistor 675 is a bi-polar junction transistor (BJT), while in other examples any of the transistor 665, transistor 670, or transistor 675 is any suitable transistor technology. In some examples, collector terminals of each of the transistor 665, transistor 670, and transistor 675 are configured to couple to a voltage source 660 (e.g., which may be the same as, or a scaled output of, the single power supply discussed above). A base terminal of the transistor 665 is coupled to an output of the amplifier 680. A first input of the amplifier 680 is configured to receive a first feedback signal (Vfb1) and a second input of the amplifier 680 is configured to receive a first reference signal (Vref1). A base terminal of the transistor 670 is coupled to an output of the comparator 685. A first input of the comparator 685 is configured to receive a second feedback signal (Vfb2) and a second input of the comparator 685 is configured to receive a second reference signal (Vref2). A base terminal of the transistor 675 is coupled to an output of the comparator 690. A first input of the comparator 690 is configured to receive a third feedback signal (Vfb3) and a second input of the comparator 690 is configured to receive a third reference signal (Vref3). While three comparators and transistors are show, in some examples more or fewer are included in the circuit 600, for example, based on a desired number of control loops desired in a multi-loop control system.

In some examples, each of Vfb1, Vfb2, and Vfb3 is a distinct feedback signal associated with control or operation of the power converter 640. The feedback signals may include a current signal, a voltage signal, a signal representative of a temperature, or any other suitable monitorable signal or value, a scope of which is not limited herein. Each of Vref1, Vref2, and Vref3 is a distinct reference signal corresponding uniquely to each of Vfb1, Vfb2, and Vfb3, respectively, such that an output of the amplifier 680, comparator 685, and comparator 690, respectively, indicates a relationship between Vfb1 and Vref1, Vfb2 and Vref2, and Vfb3 and Vref3.

In some examples, the duty cycle determination circuit 635 determines a duty cycle for control of the power converter 640 based on an output of the comparator 630 or the comparator 650. For example, the duty cycle determination circuit 635 selects one of the output of the comparator 630 or the comparator 650 that results in a minimum operable duty cycle when generating a control signal for controlling the power converter 640. For example, when one of the amplifier 680, comparator 685, or comparator 690 indicates that a respective received feedback signal is greater than a received reference signal (or alternatively, that the received reference signal is less than the received feedback signal), the comparator making the determination generates a control signal for controlling one of the transistor 665, transistor 670, or transistor 680, coupling the input of the compensation circuit 655 to (or decoupling the input of the compensation circuit 655 from) the voltage source 660. Based on this coupling or decoupling, the compensation circuit 655 modifies the received signal and provides the modified signal to the comparator 650. When the modified signal is greater than Sramp, the comparator 650 outputs a logical high signal. When the modified signal is less than Sramp, the comparator 650 outputs a logical low signal. In at least some examples, duty cycle has a relationship to compensation circuit output such that a lower compensation circuit output corresponds to a smaller duty cycle and a larger compensation circuit output corresponds to a larger duty cycle.

Similarly, the comparator 630 compares the output of the signal reconstruction circuit 615, generated according to teachings of the present disclosure, to the output of the compensation circuit 610. When the output of the signal reconstruction circuit 615 is greater than the output of the compensation circuit 610, the comparator 630 outputs a logical high signal. When the output of the signal reconstruction circuit 615 is less than the output of the compensation circuit 610, the comparator 630 outputs a logical low signal. In this way, the duty cycle determination circuit 635 generates a control signal for controlling the power converter 640 according to a value of Isense, Vfb1, Vfb2, Vfb3, or any other suitable signal or value.

In the foregoing discussion, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or IC package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., MOSFET, NMOS, PMOS, etc.), these components may be exchanged for components of other process technologies (e.g., replace MOSFET with BJT, replace NMOS with PMOS or vice versa, etc.) and reconfiguring circuits including the replaced components to provide desired functionality at least partially similar to functionality available prior to the component replacement. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
    a first node configured to couple to a first current source and a second current source;
    a first filter configured to couple between a voltage supply and the first node, the first filter being a first dynamically controllable current filter;
    a current mirror coupled between the first node and a second node, the second node configured to couple to a third current source and a fourth current source; and
    a second filter configured to couple between the second node and a ground node, the second filter being a second dynamically controllable current filter.

2. The circuit of claim 1, wherein the first filter comprises a first capacitor and a p-type metal oxide semiconductor field effect transistor (PMOS) having a gate terminal configured to receive a first control signal, a source terminal configured to couple through the first capacitor to the voltage supply, and a drain terminal coupled to the first node.

3. The circuit of claim 1, wherein the second filter comprises a second capacitor and a n-type metal oxide semiconductor field effect transistor (NMOS) having a gate terminal configured to receive a second control signal, a source terminal configured to couple through the second capacitor to the ground node, and a drain terminal coupled to the second node.

4. The circuit of claim 1, wherein the first current source is a sense element providing a signal representative of an inductor current of a power converter, and wherein the second current source provides a first signal with a negatively sloping current.

5. The circuit of claim 1, wherein the third current source provides a second signal with a first positively sloping current, and wherein the fourth current source provides a third signal with a second positively sloping current.

6. The circuit of claim 1, further comprising a comparator having a first input configured to receive an error signal (Verr) and a second input coupled to the second node.

7. The circuit of claim 1, further comprising a resistor coupled between the second node and the ground node.

8. The circuit of claim 1, wherein the current mirror comprises:
a first p-type metal oxide semiconductor field effect transistor (PMOS) having a source terminal coupled to the voltage supply, a drain terminal coupled to the first node, and a gate terminal coupled to the first node; and
a second PMOS having a source terminal coupled to the voltage supply, a gate terminal coupled to the first node, and a drain terminal coupled to the second node.

9. The circuit of claim 1, further comprising the second current source and the third current source.

10. A system, comprising:
a sense element configured to provide a sense signal;
a signal reconstruction circuit configured to couple at a first node to the sense element and comprising:
a first filter configured to couple between the first node and a voltage supply and filter a current present at the first node, the first filter being a first dynamically controllable current filter;
a current mirror coupled between the first node and a second node and configured to approximately mirror a current present at the first node to the second node; and
a second filter configured to couple between the second node and a ground node and filter a current present at the second node, the second filter being a second dynamically controllable current filter; and
a control circuit coupled to the first node and the second node and configured to:
generate and provide a first signal to the first node, the first signal having a first current subtracted from the first node;
generate and provide a second signal to the second node, the second signal having a second current added to the second node; and
generate and provide a third signal to the second node, the third signal having a third current added to the second node.

11. The system of claim 10, wherein the first filter comprises a first capacitor and a p-type metal oxide semiconductor field effect transistor (PMOS) having a gate terminal configured to receive a first control signal, a source terminal configured to couple through the first capacitor to the voltage supply, and a drain terminal coupled to the first node, and wherein the second filter comprises a second capacitor and a n-type metal oxide semiconductor field effect transistor (NMOS) having a gate terminal configured to receive a second control signal, a source terminal configured to couple through the second capacitor to the ground node, and a drain terminal coupled to the second node.

12. The system of claim 10, wherein the signal reconstruction circuit further comprises a comparator having a first input configured to receive an error signal (Verr) and a second input coupled to the second node.

13. The system of claim 10, wherein the current mirror comprises:
a first p-type metal oxide semiconductor field effect transistor (PMOS) having a source terminal coupled to the voltage supply, a drain terminal coupled to the first node, and a gate terminal coupled to the first node; and
a second PMOS having a source terminal coupled to the voltage supply, a gate terminal coupled to the first node, and a drain terminal coupled to the second node.

14. The system of claim 10, wherein the control circuit is further coupled to the first filter and the second filter and configured to control an effect of the first filter and the second filter on the signal reconstruction circuit.

15. The system of claim 14, wherein the control circuit controls the first filter to filter leading edge noise of a signal present at the first node, and wherein the control circuit controls the second filter to filter signal discontinuities of a signal present at the second node.

16. A method, comprising:
receiving, by a circuit, a sense signal representative of an inductor current of a power converter;
subtracting, by the circuit, a first current from the sense signal;
filtering, by the circuit, the sense signal;
adding, by the circuit, a second current to the sense signal;
adding, by the circuit, a third current to the sense signal to generate a reconstructed sense signal; and
filtering, by the circuit, the reconstructed sense signal.

17. The method of claim 16, further comprising comparing, by the circuit, the filtered reconstructed sense signal to an error signal (Verr).

18. The method of claim 16, further comprising generating the first current, the second current, and the third current.

19. The method of claim 16, further comprising generating a first control signal configured to at least partially control filtering the sense signal and generating a second control signal configured to at least partially control filtering the reconstructed sense signal.

20. The method of claim 16, wherein the filtering of the sense signal and the reconstructed sense signal occurs at a rising edge.

* * * * *